US012736415B2

(12) United States Patent
Ravi et al.

(10) Patent No.: US 12,736,415 B2
(45) Date of Patent: Sep. 15, 2026

(54) VACUUM SEALING INTEGRITY OF CRYOGENIC ELECTROSTATIC CHUCKS USING NON-CONTACT SURFACE TEMPERATURE MEASURING PROBES

(71) Applicant: Applied Materials, Inc., Santa Clara, CA (US)

(72) Inventors: Sankaranarayanan Ravi, Santa Clara, CA (US); Alvaro Garcia, Mountain View, CA (US); Martin Perez Guzman, Santa Clara, CA (US); Stephen Donald Prouty, San Jose, CA (US); Andrew Antoine Noujaim, Morgan Hill, CA (US)

(73) Assignee: Applied Materials, Inc., Santa Clara, CA (US)

( * ) Notice: Subject to any disclaimer, the term of this patent is extended or adjusted under 35 U.S.C. 154(b) by 275 days.

(21) Appl. No.: 18/368,052

(22) Filed: Sep. 14, 2023

(65) Prior Publication Data

US 2024/0110836 A1 Apr. 4, 2024

Related U.S. Application Data

(60) Provisional application No. 63/412,260, filed on Sep. 30, 2022.

(51) Int. Cl.
*G01K 11/00* (2006.01)
*H01J 37/32* (2006.01)

(52) U.S. Cl.
CPC ........ *G01K 11/00* (2013.01); *H01J 37/32715* (2013.01); *H01J 2237/2007* (2013.01); (Continued)

(58) Field of Classification Search
None
See application file for complete search history.

(56) References Cited

U.S. PATENT DOCUMENTS 5,509,375 A * 4/1996 Sayka .................. B05B 12/004 250/222.2
6,481,886 B1 * 11/2002 Narendrnath ..... H01L 21/67248 374/161

(Continued)

FOREIGN PATENT DOCUMENTS

CN 102401703 A 4/2012
CN 106168511 A 11/2016

(Continued)

OTHER PUBLICATIONS

International Search Report dated Jan. 3, 2024 re: PCT Applicatin No. PCT/US20203/032862.

(Continued)

*Primary Examiner* — Erica S Lin
(74) *Attorney, Agent, or Firm* — Patterson + Sheridan, LLP

(57) ABSTRACT

The disclosure relates to a substrate support assembly and apparatus for measuring the temperature of a substrate disposed on the support assembly. In one embodiment, a substrate temperature measurement apparatus includes a substrate support assembly, a probe assembly, and a probe target. The substrate support assembly includes an electrostatic chuck and one or more plates. The probe assembly within the substrate support assembly extends through one or more of the one or more plates. The probe assembly includes an optical probe sensor, an optical fiber coupled to the optical probe sensor, and an insulating sheath surrounding the optical fiber. The probe target includes a phosphor coating, is in contact with the electrostatic chuck, and is spaced from the probe assembly.

24 Claims, 2 Drawing Sheets

(52) U.S. Cl.
CPC ................ *H01J 2237/24585* (2013.01); *H01J 2237/334* (2013.01)

(56) References Cited

U.S. PATENT DOCUMENTS

| | | | | |
|---|---|---|---|---|
| 11,380,572 | B2 | 7/2022 | Prouty et al. | |
| 2003/0112848 | A1 | 6/2003 | Khan | |
| 2005/0274324 | A1 | 12/2005 | Takahashi et al. | |
| 2008/0062612 | A1 * | 3/2008 | Morioka | H01L 21/6833 361/234 |
| 2009/0022205 | A1 | 1/2009 | Comendant | |
| 2018/0323093 | A1 | 11/2018 | Zhang et al. | |
| 2020/0118850 | A1 | 4/2020 | Zhang et al. | |
| 2021/0287876 | A1 | 9/2021 | Nagai et al. | |

FOREIGN PATENT DOCUMENTS

| | | | |
|---|---|---|---|
| CN | 110603634 | A | 12/2019 |
| JP | 2007116098 | A | 5/2007 |
| JP | 2017011169 | A | 1/2017 |
| JP | 2019521522 | A | 7/2019 |
| JP | 2021525858 | A | 9/2021 |
| TW | 201608660 | A | 3/2016 |

OTHER PUBLICATIONS

Office Action from Taiwanese Application No. 112135654 dated Sep. 30, 2025.
Korean Office Action for Application No. 10-2025-7013355 dated Dec. 31, 2025.
Office Action from Japanese Patent Application No. 2025-518037 dated Apr. 28, 2026.

* cited by examiner

VACUUM SEALING INTEGRITY OF CRYOGENIC ELECTROSTATIC CHUCKS USING NON-CONTACT SURFACE TEMPERATURE MEASURING PROBES

CROSS-REFERENCE TO RELATED APPLICATIONS

This application claims benefit of U.S. Provisional Application No. 63/412,260, filed on Sep. 30, 2022, the entirety of which is herein incorporated by reference.

BACKGROUND

Field

Embodiments of the present disclosure generally relate to apparatus used to measure operating conditions inside a semiconductor substrate processing chamber and, more specifically, to an apparatus for measuring substrate temperatures by detecting light emissions from a modular component.

Description of the Related Art

The materials and processes used to process a semiconductor substrate in a semiconductor processing system are highly sensitive to temperature changes. Should these materials be exposed to excessive temperatures or gradients resulting from poor heat stabilization or transfer, yield or performance of the end product is compromised. For example, if process temperatures are not properly controlled, processes such as etch selectivity and deposition reactions are compromised, along with a degradation in process uniformity. As a result, the circuitry formed upon the semiconductor substrate are defectively constructed and/or suffer unacceptable variations between devices.

A substrate support, or pedestal, residing in a semiconductor processing chamber is in intimate contact with the substrate and serves both as a heat sink and substrate support. Most pedestals are cooled by thermal conduction to a liquid cooled base where a constant flow of coolant removes excess heat. It has been found that measuring the temperature of the pedestal provides a good indication of the substrate temperature. One method of determining pedestal temperature is to measure the temperature of the coolant at an outlet of the base. Unfortunately, this method is limited in that the measured temperature is neither an accurate nor timely measure of the pedestal temperature. For example, the coolant temperature in the base is measured after the coolant has passed through several interfaces, conduits, and heat sinks. Use of such unreliable, delayed data (i.e., as a temperature control feedback system parameter) renders substrate temperature stabilization difficult.

Another technique involves diffused reflectance spectroscopy. A wavelength of light reflected from the substrate surface is chosen for monitoring. A spectrometer measures the level of backscattering of the chosen wavelength (with specific energy and related temperature characteristics) to derive a substrate temperature. However, this approach is susceptible to erroneous measurements from energy received from other "hot" surfaces proximate to the measuring equipment.

Yet another technique attempts to measure the pedestal temperature directly during substrate processing by placing thermocouple probes in contact with the pedestal. However, thermocouple probes placed in direct contact with the pedestal may be subjected to radio frequency (RF) interference from a plasma used to process the substrate which leads to temperature measurement inaccuracies. In addition, increased complexity of the pedestal is an undesirable result of thermocouple utilization. Movement of the thermocouple into and out of contact with the pedestal introduces sealing requirements in both atmospheric and vacuum environments. Further, leaks resulting from poor sealing around the thermocouple can lead to contamination and other deleterious effects during substrate processing. Thermocouple probes are also cumbersome to install and secure to a pedestal. For example, a small, narrow bore must be formed in the pedestal which is difficult to manufacture. Additionally, as the thermocouple is typically cemented or otherwise adhered to the pedestal at the bottom of the bore, replacement of the thermocouple requires extensive rework and down time.

Therefore, there exists a need in the art for an apparatus that can provide an accurate, real-time measurement of pedestal temperature.

SUMMARY

The present disclosure generally relates to a substrate support assembly and apparatus for measuring the temperature of a substrate disposed on the support assembly. In one embodiment, a substrate temperature measurement apparatus includes a substrate support assembly, a probe assembly, and a probe target. The substrate support assembly includes an electrostatic chuck and one or more plates. The probe assembly within the substrate support assembly extends through one or more of the one or more plates. The probe assembly includes an optical probe sensor, an optical fiber coupled to the optical probe sensor, and an insulating sheath surrounding the optical fiber. The probe target includes a phosphor coating, is in contact with the electrostatic chuck, and is spaced from the probe assembly.

In another embodiment, a substrate support assembly includes an electrostatic chuck and one or more plates and a probe assembly. The probe assembly is within and extends through one or more plates within the electrostatic chuck. The probe assembly includes an optical probe sensor, an optical fiber coupled to the optical probe sensor, and an insulating sheath surrounding the optical fiber. The substrate support assembly also includes a probe target with a phosphor coating, the probe target in contact with the electrostatic chuck, and spaced a distance away from the probe assembly.

In another embodiment, a substrate support assembly includes an electrostatic chuck with one or more plates and a probe assembly. The probe assembly is within and extends through one or more plates within the electrostatic chuck. The probe assembly includes an optical probe sensor, an optical fiber coupled to the optical probe sensor, an insulating sheath surrounding the optical fiber, and a housing. The housing is within the electrostatic chuck and the housing includes a cavity and a seal. The seal is disposed within a seal recess of the housing. The optical fiber and insulating sheath pass through the cavity and are surrounded by a sealant within the cavity. The substrate support assembly also includes a probe target with a phosphor coating, the probe target in contact with the electrostatic chuck, and spaced a distance away from the probe assembly.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of the scope of the disclosure, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein provide a substrate support assembly which enables temperature measurement of a substrate at temperatures less than about −20 degrees Celsius or above about 300 degrees Celsius during substrate processing.

Although the substrate support assembly is described below in an etch processing chamber, the substrate support assembly may be utilized in other types of processing chambers, such as physical vapor deposition chambers, chemical vapor deposition chambers, plasma enhanced chemical vapor deposition chambers, ion implantation chambers, among others, and other systems where processing necessitates a substrate maintained at temperatures less than about −20 degrees Celsius or greater than about 300 degrees Celsius. The substrate support assembly disclosed herein may also be utilized at temperatures between −20 degrees Celsius and 300 degrees Celsius.

Figure 1:
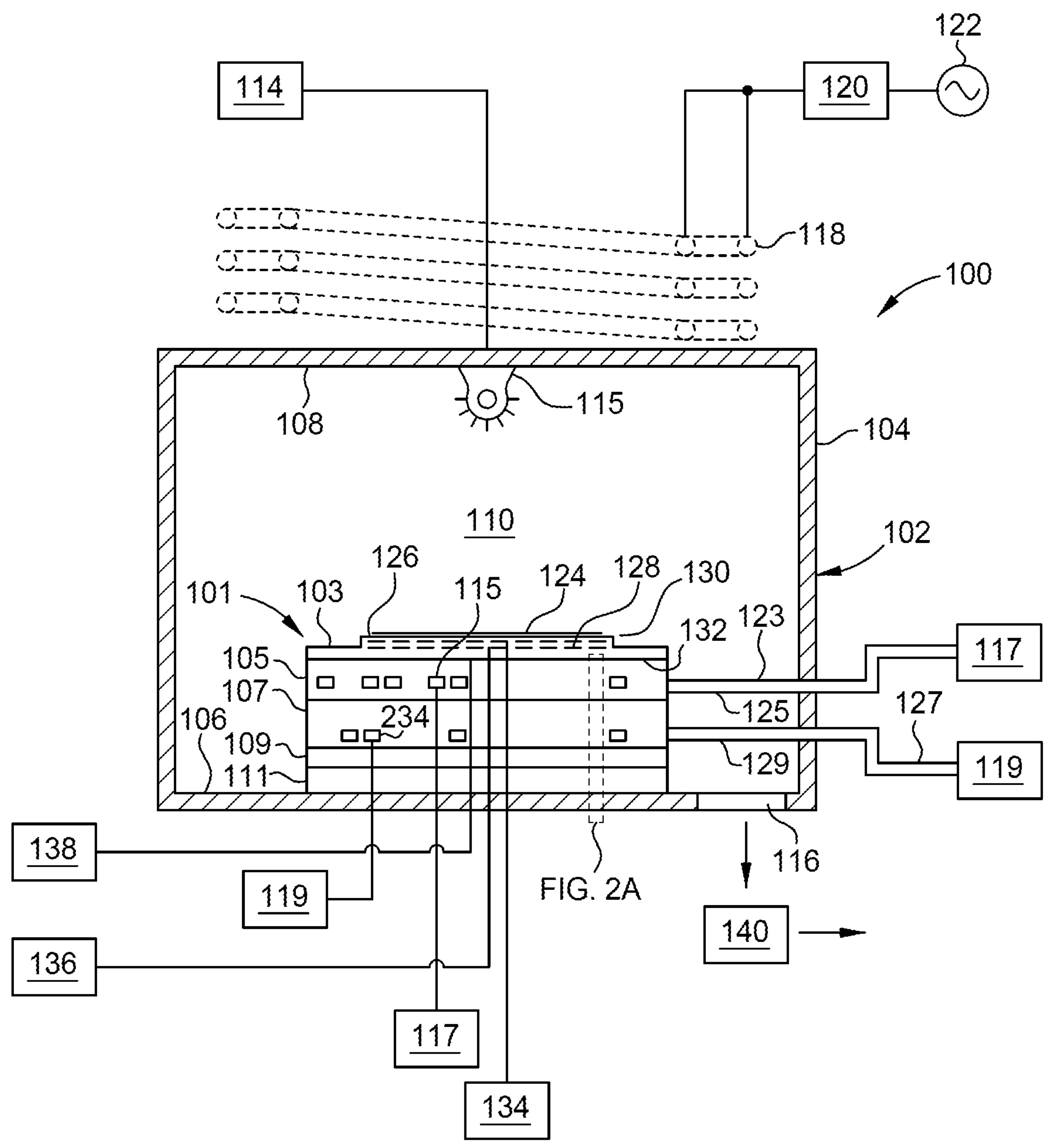
FIG. 1 illustrates a schematic cross-sectional view of a plasma processing chamber, according to an embodiment of the disclosure.

FIG. 1 illustrates a schematic cross-sectional view of an exemplary plasma process chamber 100, shown configured as an etch chamber, having a substrate support assembly 101. The substrate support assembly 101 may be utilized in other types of processing chambers, for example plasma treatment chambers, annealing chambers, physical vapor deposition chambers, chemical vapor deposition chambers, and ion implantation chambers, among others, as well as other systems where the ability to uniformly maintain a surface or work piece, such as a substrate 124, at temperatures less than about −20 degrees Celsius is desirable. Dry reactive ion etching a substrate 124 maintained at temperatures less than −20 degrees Celsius or greater than 300 degrees Celsius enables ions to bombard the upward facing surfaces of materials disposed on the substrate 124 with decreased spontaneous etching so that trenches with smooth, vertical sidewalls are formed. One of the many advantages of these techniques includes an improved selectivity of etching one material versus another at temperatures less than −20 degrees Celsius. For example, selectivity between silicon (Si) and silicon dioxide ($SiO_2$) increases exponentially as temperature is decreased.

The plasma process chamber 100 includes a chamber body 102 having sidewalls 104, a bottom 106, and a lid 108 that enclose a process region 110. An injection apparatus 112 is coupled to the sidewalls 104 and/or lid 108 of the chamber body 102. A gas panel 114 is coupled to the injection apparatus 112 to enable delivery of process gases into the process region 110. The injection apparatus 112 may be one or more nozzle or inlet ports, or alternatively, a showerhead. Process gases, along with any processing by-products, are removed from the process region 110 through an exhaust port 116 formed in the sidewalls 104 or bottom 106 of the chamber body 102. The exhaust port 116 is coupled to a pump system 140, which includes throttle valves and pumps utilized to control the vacuum levels within the process region 110.

Process gases are energized to form a plasma within the process region 110. In one embodiment, process gases are energized by capacitively or inductively coupling RF power to the process gases. In this embodiment, which can be combined with other embodiments described herein, depicted in FIG. 1, a plurality of coils 118 are disposed above the lid 108 of the plasma process chamber 100 and coupled through a matching circuit 120 to an RF power source 122.

The substrate support assembly 101 is disposed in the process region 110 below the injection apparatus 112. The substrate support assembly 101 includes an electrostatic chuck (ESC) 103 and an ESC base assembly 105. The ESC base assembly 105 is coupled to the ESC 103 and a facility plate 107. The facility plate 107 is supported by a ground plate 111 and is configured to facilitate electrical, cooling, heating, and gas connections with the substrate support assembly 101. The ground plate 111 is supported by the bottom 106 of the processing chamber. An insulator plate 109 insulates the facility plate 107 from the ground plate 111. In some embodiments, the process region 110 is under vacuum during process operations. The internal connections of the substrate support assembly 101 include seals to prevent leaks into the process region 110 through the substrate support assembly 101. In some embodiments, the process region 110 is partially defined by the connections within the insulator plate 109.

In one embodiment, a bottom surface 132 of the ESC 103 is coupled to the ESC base assembly 105. In one embodiment, the ESC base assembly 105 includes a molybdenum alloy, or like material, and can be attached to the ESC 103 with an elastomeric material or other suitable bonding material. Mechanical connections may also be utilized to attach the ESC base assembly 105 to the ESC 103. A lower surface 210 (FIG. 2A) of the ESC base assembly 105 is disposed in contact with the facility plate 107. The facility plate 107 is disposed between the ESC base assembly 105 and the insulator plate 109. The insulator plate 109 is disposed beneath the facility plate 107, opposite the ESC 103.

The ESC base assembly 105 includes a base channel 115 coupled to a cryogenic chiller 117. The cryogenic chiller 117 is in fluid communication with the base channel 115 via a base inlet conduit 123 connected to an inlet of the base channel 115 and via a base outlet conduit 125 connected to an outlet of the base channel 115 such that the ESC base assembly 105 is maintained at temperatures less than −20 degrees Celsius. The cryogenic chiller 117 is coupled to an interface box to control a flow rate of a base fluid. The base fluid may include a material that can maintain a temperature less than −50 degrees Celsius. The cryogenic chiller 117 provides the base fluid, which is circulated through the base channel 115 of the ESC base assembly 105. The base fluid flowing through the base channel 115 enables the ESC base assembly 105 to be maintained at temperatures less than −20 degrees Celsius, which assists in controlling the lateral temperature profile of the ESC 103 so that a substrate 124 disposed on the ESC 103 is uniformly maintained at temperatures less than −20 degrees Celsius. In one embodiment, which can be combined with other embodiments described herein, the cryogenic chiller 117 is a single-stage chiller operable to maintain the base fluid at temperature less than about −50 degrees Celsius. In another embodiment, which can be combined with other embodiments described herein, the cryogenic chiller 117 is a chiller that utilizes refrigerant internal to the chiller such that the base fluid is maintained at temperatures less than −50 degrees Celsius.

The facility plate 107 includes a facility channel 234 coupled to a chiller 119. The chiller 119 is in fluid communication with the facility plate 107 via a facility inlet conduit 127 and a facility outlet conduit 129 such that the facility plate 107 is maintained a predetermined ambient temperature. The cryogenic chiller 119 is coupled to an interface box to control a flow rate of the facility fluid. The facility fluid may include a material that can maintain an ambient temperature between about −10 degrees Celsius to about 60 degrees Celsius. The chiller 119 provides the facility fluid, which is circulated through the facility plate 107. The facility fluid enables the facility plate 107 to be maintained at a predetermined ambient temperature, which assists in maintaining the insulator plate 109 at the predetermined ambient temperature.

The ESC 103 has a support surface 130 and the bottom surface 132 opposite the support surface 130. In one embodiment, which can be combined with other embodiments described herein, the ESC 103 is fabricated from a ceramic material, such as alumina ($Al_2O_3$), aluminum nitride (AlN) or other suitable material. Alternately, the ESC 103 may be fabricated from a polymer, such as polyimide, polyetheretherketone, polyaryletherketone and the like.

The ESC 103 includes a chucking electrode 126 disposed therein. The chucking electrode 126 may be configured as a monopolar or bipolar electrode, or other suitable arrangement. The chucking electrode 126 is coupled through an RF filter and the facility plate 107 to a chucking power source 134, which provides a DC power to electrostatically secure the substrate 124 to the support surface 130 of the ESC 103. The RF filter prevents RF power utilized to form a plasma (not shown) within the plasma processing chamber 100 from damaging electrical equipment or presenting an electrical hazard outside the chamber.

The ESC 103 includes one or more resistive heaters 128 embedded therein. The resistive heaters 128 are utilized to elevate the temperature, if desired, of the ESC 103 to a temperature suitable for processing a substrate 124 disposed on the support surface 130. The resistive heaters 128 are coupled through the facility plate 107 and an RF filter to a heater power source 136. The RF filter prevents RF power utilized to form a plasma (not shown) within the plasma processing chamber 100 from damaging electrical equipment or presenting an electrical hazard outside the chamber. The heater power source 136 may provide 500 watts or more power to the resistive heaters 128. The heater power source 136 includes a controller (not shown) utilized to control the operation of the heater power source 136, which is generally set to heat the substrate 124 when needed in order to maintain the substrate temperature at a desired temperature, for example, under about −20 degrees Celsius. Stated differently, heat from the resistive heaters 128 and cooling from the base fluid circulating through the ESC base assembly 105 are balanced to maintain the substrate 124 at a desired temperature at or under −20 degrees Celsius. In one embodiment, the ESC base assembly 105 includes two internal bases (shown In FIG. 2A). For example, the resistive heaters 128 and the base fluid circulating through the ESC base assembly 105 maintain the substrate 124 at a temperature suitable for processing that is less than about −20 degrees Celsius, such as between about −20 degrees Celsius to about −150 degrees Celsius. In another embodiment, the resistive heaters 128 are utilized to maintain the substrate 124 at an elevated temperature, for example, above about 300 degrees Celsius.

The resistive heaters 128 include a plurality of laterally separated heating zones, wherein the controller enables at least one zone of the resistive heaters 128 to be preferentially heated relative to the resistive heaters 128 located in one or more of the other zones. For example, the resistive heaters 128 may be arranged concentrically in a plurality of separated heating zones. The separated heating zones of the resistive heaters 128 assist controlling the lateral edge to center temperature uniformity of the substrate 124.

The substrate support assembly 101 may include one or more probes disposed therein. The ESC 103 is coupled a probe controller 138. A probe tip 222 (shown in FIG. 2B) in communication with the probe controller 138 is disposed in the base assembly 105 at or adjacent to the surface of the ESC 103 to determine the temperature of the ESC 103. Thus, the probe tip 222, in communication with the probe controller 138, may be used to calibrate of the temperature of the substrate 124 based on the temperature of the ESC base assembly 105. The probe controller 138 is communicatively coupled to the heater power source 136 so that each zone of the resistive heaters 128 is independently heated for the lateral temperature profile of the ESC 103 to be substantially uniform based on temperature measurements so that a substrate 124 disposed on the ESC 103 is uniformly maintained at temperatures less than −20 degrees Celsius.

The probe controller 138 includes a programmable central processing unit (CPU) which is operable with a memory (e.g., non-volatile memory) and support circuits. The support circuits are conventionally coupled to the CPU and comprise cache, clock circuits, input/output subsystems, power supplies, and the like, and combinations thereof coupled to the various components of the chamber 100, to facilitate control thereof. The CPU is one of any form of general purpose computer processor used in an industrial setting, such as a programmable logic controller (PLC), for controlling various components and sub-processors of the processing system. The memory, coupled to the CPU, is non-transitory and is typically one or more of readily available memories such as random access memory (RAM), read only memory (ROM), floppy disk drive, hard disk, or any other form of digital storage, local or remote.

Typically, the memory is in the form of a non-transitory computer-readable storage media containing instructions (e.g., non-volatile memory), which when executed by the CPU, facilitates the operation of the chamber 100. The instructions in the memory are in the form of a program product such as a program that implements the methods of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein).

Illustrative non-transitory computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory devices, e.g., solid state drives (SSD)) on which information may be permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure. In some embodiments, the methods set forth herein, or portions thereof, are performed by one or more application specific integrated circuits (ASICs), field-programmable gate arrays (FPGAs), or other types of hardware implementations. In some other embodiments, the substrate processing and/or handling methods set forth herein are performed by a combination of software routines, ASIC(s), FPGAs and, or, other types of hardware implementations. One or more system controllers 138 may be used with one or any combination of the various systems described herein.

Figure 2A:
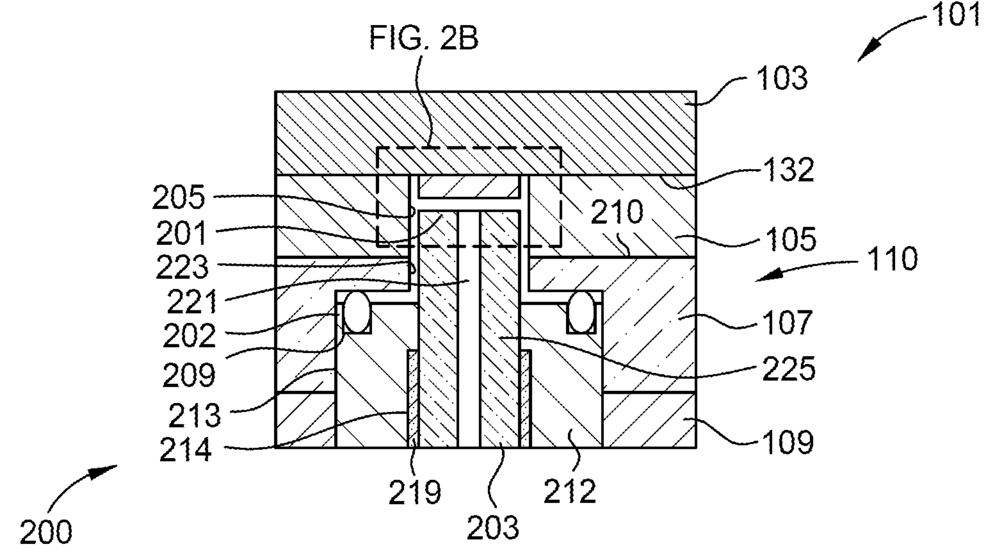
FIG. 2A illustrates a schematic, partial cross-sectional view of a probe assembly and low temperature pedestal, according to an embodiment of the disclosure.

FIG. 2A illustrates a schematic, partial cross-sectional enlarged view of support assembly 101 from box 2A in FIG. 1. The support assembly 101 includes a probe assembly 200 disposed within cavities of the support assembly 101 that enables components of the probe assembly 200 to monitor the temperature of the ESC 103. The probe assembly 200 is disposed within a bore tube 223 and a lower cavity 213. The bore tube 223 is a cavity within the ESC base 105 and the facility plate 107. The lower cavity 213 is a cavity connected to the bore tube 223. The lower cavity 213 is disposed within the facility plate 107 and the insulator plate 109. In some embodiments, the bore tube 223 is a cylindrical cavity that expands into the lower cavity 213 within the facility plate 107.

The probe assembly 200 is configured to enable measurement of temperatures less than about 10° Celsius. For example, the probe assembly 200 can measure temperatures between about 100° Celsius to about −50° Celsius.

The probe assembly 200 includes a target 206 (FIG. 2B) disposed at a first end 201 of the probe assembly, an optical fiber 221, an optical sheath 225 disposed radially outward of the optical fiber 221, a housing 212, and a housing seal 202. The target 206 is disposed in contact with the bottom surface 132 of the ESC 103. The optical fiber 221 travels from the first end 201 and passes through the ESC base assembly 105 and the facility plate 107 to a second end 203 of the probe assembly 200. The second end 203 of the probe assembly 200 is disposed within the insulator plate 109. In some embodiments, the probe assembly 200 also includes an optical sensor (not shown) that is capable of reading signals to determine at least temperature. The probe assembly 200 is connected to the probe controller 138 (FIG. 1). The probe controller 138 uses signals to determine the temperature of the ESC 103. The signals include light transmitted through the optical fiber 221. In some embodiments, the optical sensor (not shown) is in the probe controller 138 and is capable of reading signals to determine the temperature of the ESC 103.

The portion of the probe assembly 200 disposed within the bore tube 223 is a bore 205. The bore 205 is the portion of the optical sheath 225 and optical fiber 221 that extend from the housing 212 to the first end 201 of the probe assembly 200. The probe housing 212 includes the portion of the optical sheath 225 and optical fiber 221 within the lower cavity 213. The probe housing 212 also includes a recess 209 within which a seal 202 is disposed. The recess 209 is a recess on the housing face directed towards the ESC 103. The seal 202 is disposed in the seal recess 209 and between the probe housing 212 and the facility plate 107. The seal 202 separates a process region 110 from the insulator plate 109 and other non-substrate processing regions. The process region 110 includes the portions of the facility plate 107, and components found in the ESC base assembly 105 above the insulator plate 109 and housing 212. The seal 202 is a circular member surrounding the bore 205. The seal 202 is fabricated from an elastomeric material that is selected to enable sealing at temperatures below about 10° Celsius.

The probe housing 212 is disposed opposite the first end 201 of the probe assembly 200. The probe housing 212 represents the second end 203 of the probe assembly 200. The probe housing 212 is fabricated from a metallic material, such as an alloy or the like, and the probe housing 212 is disposed within and extending through both the facility plate 107 and insulator plate 109. The probe housing 212 contains a sealant 219 that fills a void 214 in the probe housing 212. In one embodiment, the sealant 219 is an epoxy material or other material suitable to fill the void 214 and not expand or contract excessively at temperatures experienced by the support assembly 101 during operation.

Figure 2B:
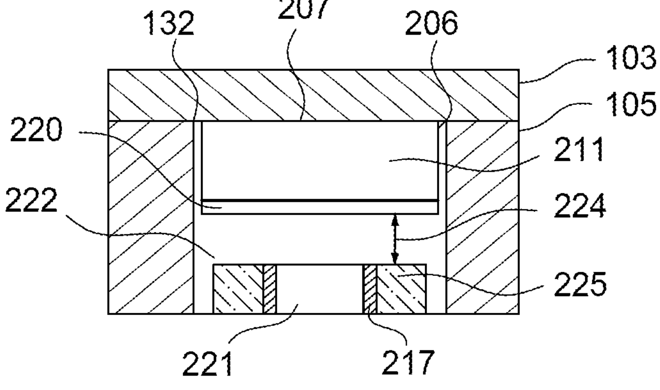
FIG. 2B illustrates a detailed schematic cross-sectional view of a probe target illustrated in FIG. 2A, according to an embodiment of the disclosure.

FIG. 2B illustrates a detailed schematic cross-sectional view of the probe target 206 illustrated in box 2B of FIG. 2A. The probe target 206 is disposed at the first end 201 of the probe assembly 200. In one embodiment, the probe target 206 is recessed in the ESC base assembly 105. In another embodiment, the probe target 206 is coupled to the ESC 103.

The probe target 206 includes a photoluminescent material 220, a target core 211, and may include a target layer 207. The target layer 207 is disposed in contact with the ESC 103. The thickness of the target layer 207 is sufficient to reduce deleterious effects of thermal gradients on thermal measurement. The target layer 207 may be an adhesive that translates thermal energy from the ESC to the target 206. The target layer 207 is disposed between the target core 211 and the ESC 103. In some embodiments, the target core 211 is fabricated from a ceramic material, for example, alumina or the like. In other words, the core 211 is a ceramic core. The photoluminescent material 220 is disposed opposite the target layer 207 and adhered to target core 211. As such, the target core 211 is disposed between the target layer 207 and the photoluminescent material 220. In some embodiments, the target core 211 is a metallic alloy infused with the photoluminescent material 220. While the probe target 206 is illustrated as being coupled to a surface of the ESC 103, it is contemplated that the probe target 206 may be recessed within the ESC 103.

The photoluminescent material 220 is a phosphor material in one embodiment and has a rate of decay in luminescence from an excited state, which is caused by exposure to one or more wavelengths of light that correlates to a temperature of the photoluminescent material 220. For example, the photoluminescent material 220 may be fabricated from a phosphorous containing material. The photoluminescent material 220 may also contain a binder that is chemically compatible with photoluminescent material 220 and transparent to the wavelengths associated with the excitation and emission of the photoluminescent material 220. When the photoluminescent material 220 is a layer, the thickness of the photoluminescent material 220 is between about 0.01 mm and about 0.5 mm, such as about 0.25 mm thick. As such, the thickness of the photoluminescent material 220 is selected to reduce deleterious effects of thermal gradients on thermal measurement.

The optical fiber 221, is positioned at a tip 222 of the probe assembly 200. In one embodiment, the tip 222 of the optical fiber operates as a sensor. The tip 222 of the optical fiber 221 receives light from the photoluminescent material 220 which enables optical remote temperature sensing. The optical fiber 221 is disposed opposite and directed to face the probe target 206 having the photoluminescent material 220 disposed thereon. Between the temperature probe tip 222 and photoluminescent material 220 is a gap 224. In one embodiment the gap 224 is a distance of between about 0.1 mm and about 10 mm, such as about 5 mm. The gap 224 is utilized to mitigate the effects of thermal cycling on the temperature probe tip 222 and to avoid conduction of thermal energy through the bore tube 223.

The bore tube 223 includes the optical sheath 225 and the optical fiber 221. The optical sheath 225 is disposed between the inside of the bore 205 and the outside of the optical fiber 221 and has a coating 217 between the optical fiber 221 and the optical sheath 225. The optical sheath 225 is fabricated from a thermally and/or electrically insulating material, and/or a cladding material or the like. The optical fiber 221 is fabricated from a material capable of transmitting light, for example, quartz or the like. The coating 217 is a sealant capable of sealing the bore tube 223 against a vacuum at low temperatures.

Embodiments in the disclosure include a probe assembly that enables temperature monitoring of an ESC in a chamber under vacuum. Having a target coupled to the bottom of an ESC lowers the number of potential seals required to prevent leakage into the chamber. This is especially beneficial in cryogenic applications where smaller seals are more likely to fail at lower temperatures. Sealing the vacuum of the process chamber farther into the substrate support assembly allows for much larger and more robust sealing methods and enhances accuracy by keeping probe targets in a vacuum. The target being in a vacuum further minimizes incorrect temperature readings caused by translation of thermal energy between non-process region bodies.

While the foregoing is directed to embodiments of the present disclosure, other and further embodiments of the disclosure may be devised without departing from the basic scope thereof, and the scope thereof is determined by the claims that follow.

What is claimed is:

1. A substrate temperature measurement apparatus, comprising:
- a substrate support assembly comprising an electrostatic chuck and one or more plates;
- a probe assembly disposed within the substrate support assembly and extending through one or more of the one or more plates, the probe assembly comprising:
  - an optical probe sensor;
  - an optical fiber coupled to the optical probe sensor; and
  - an insulating sheath surrounding the optical fiber; and
- a probe target in contact with the electrostatic chuck, the probe target comprising a coating of photoluminescent material, wherein the probe target is spaced from the probe assembly.

2. The substrate temperature measurement apparatus of claim 1, wherein the probe assembly further comprises a seal disposed on a housing, the housing disposed within the one or more plates.

3. The substrate temperature measurement apparatus of claim 2, wherein the seal is disposed around the optical fiber and is configured to maintain a vacuum around the electrostatic chuck.

4. The substrate temperature measurement apparatus of claim 2, wherein the housing further comprises a sealant disposed within a void within the housing and surrounding the insulating sheath.

5. The substrate temperature measurement apparatus of claim 1, wherein the coating is disposed on a core of the probe target.

6. The substrate temperature measurement apparatus of claim 5, wherein the core comprises a ceramic material.

7. The substrate temperature measurement apparatus of claim 1, wherein the optical fiber is directed at the coating of the probe target.

8. The substrate temperature measurement apparatus of claim 1, wherein the probe assembly is connected to a probe controller.

9. A substrate support assembly, comprising:
- an electrostatic chuck and one or more plates;
- a probe assembly disposed within the electrostatic chuck, the probe assembly extending through one or more of the one or more plates, the probe assembly comprising:
  - an optical probe sensor;
  - an optical fiber coupled to the optical probe sensor; and
  - an insulating sheath surrounding the optical fiber; and
- a probe target in contact with the electrostatic chuck and a distance away from a tip of the optical fiber, the probe target comprising a coating of photoluminescent material.

10. The substrate support assembly of claim 9, wherein probe target is disposed on a bottom surface of the electrostatic chuck.

11. The substrate support assembly of claim 9, wherein a target core of the probe target comprises a metallic alloy infused with the photoluminescent material.

12. The substrate support assembly of claim 9, wherein probe target comprises a ceramic core and a photoluminescent material disposed between the optical fiber and the ceramic core.

13. The substrate support assembly of claim 9, wherein the optical fiber is directed at the coating of the probe target.

14. The substrate support assembly of claim 9, wherein the probe assembly is connected to a probe controller.

15. The substrate support assembly of claim 9, wherein the probe assembly further comprises a housing comprising a sealant disposed within a void within the housing and surrounding the insulating sheath.

16. The substrate support assembly of claim 15, wherein the probe assembly further comprises a seal disposed on a housing, the housing disposed within the one or more plates.

17. The substrate support assembly of claim 16, wherein the seal is disposed around the optical fiber and is configured to maintain a vacuum around the electrostatic chuck.

18. A substrate support assembly, comprising:
- an electrostatic chuck and one or more plates;
- a probe assembly disposed within the substrate support assembly and extending through one or more of the one or more plates, the probe assembly comprising:
  - an optical probe sensor;
  - an optical fiber coupled to the optical probe sensor;
  - an insulating sheath surrounding the optical fiber;
  - a housing disposed within the electrostatic chuck, the housing comprising:
    - a seal disposed in a seal recess of the housing; and a cavity within the housing, the optical fiber and insulating sheath disposed through the cavity; and a sealant disposed within the cavity surrounding the insulating sheath; and a probe target in contact with a bottom surface of the electrostatic chuck and a distance away from a tip of the optical fiber, the probe target comprising a coating of photoluminescent material.

19. The substrate support assembly of claim 18, wherein a target core of the probe target comprises a metallic alloy infused with the photoluminescent material.

20. The substrate support assembly of claim 18, wherein probe target comprises a ceramic core and a photoluminescent material disposed between the optical fiber and the ceramic core.

21. The substrate temperature measurement apparatus of claim 1, wherein the probe assembly is configured to enable measurement of temperatures less than about 10° Celsius.

22. The substrate temperature measurement apparatus of claim 1, wherein the probe assembly is configured to measure temperatures between about 100° Celsius to about −50° Celsius.

23. The substrate support assembly of claim 9, wherein the probe assembly is configured to enable measurement of temperatures less than about 10° Celsius.

24. The substrate support assembly of claim 9, wherein the probe assembly is configured to measure temperatures between about 100° Celsius to about −50═ Celsius.

* * * * *